(12) United States Patent
Scott et al.

(10) Patent No.: US 12,107,037 B2
(45) Date of Patent: Oct. 1, 2024

(54) SEMICONDUCTOR DEVICES AND METHODS OF MANUFACTURING ELECTRONIC DEVICES

(71) Applicant: Amkor Technology Singapore Holding Pte. Ltd., Singapore (SG)

(72) Inventors: George Scott, Chandler, AZ (US); Ki Yeul Yang, Seoul (KR); Jae Hun Bae, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 316 days.

(21) Appl. No.: 17/517,829

(22) Filed: Nov. 3, 2021

(65) Prior Publication Data
US 2023/0137998 A1    May 4, 2023

(51) Int. Cl.
*H01L 23/498* (2006.01)
*H01L 21/48* (2006.01)
*H01L 21/56* (2006.01)
*H01L 21/683* (2006.01)
*H01L 23/00* (2006.01)
*H01L 23/31* (2006.01)

(52) U.S. Cl.
CPC .... *H01L 23/49838* (2013.01); *H01L 21/4853* (2013.01); *H01L 21/4857* (2013.01); *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/49822* (2013.01); *H01L 24/16* (2013.01); *H01L 2221/68372* (2013.01); *H01L 2224/16227* (2013.01); *H01L 2924/18161* (2013.01)

(58) Field of Classification Search
CPC .......... H01L 23/49838; H01L 21/4853; H01L 21/4857; H01L 21/563; H01L 21/565; H01L 21/568; H01L 21/6835; H01L 23/3128; H01L 23/3135; H01L 23/49822; H01L 24/16; H01L 2221/68372; H01L 2224/16227; H01L 2924/18161; H01L 23/5383; H01L 21/561; H01L 23/49816; H01L 2221/68345; H01L 2221/68381; H01L 24/81
USPC ......................................................... 257/668
See application file for complete search history.

(56) References Cited

U.S. PATENT DOCUMENTS 7,173,828 B2 * 2/2007 Lin ...................... H05K 3/3452
                                                              257/E23.079
7,288,841 B2 * 10/2007 Yamano .............. H01L 23/5389
                                                              257/E25.023

(Continued)

*Primary Examiner* — Vu A Vu
(74) *Attorney, Agent, or Firm* — Spectrum IP Law Group LLC

(57) ABSTRACT

In one example, a semiconductor device comprises a substrate comprising a top side and a bottom side, a dielectric structure, and a conductive structure, wherein the conductive structure comprises a first terminal exposed from the dielectric structure, an electronic component over the top side of the substrate, and an encapsulant over the top side of the substrate and covering a lateral side of the electronic component. The dielectric structure comprises a first pattern base and first pattern wall that extends from the first pattern base and is adjacent to the first terminal, and the first terminal is bounded by the first pattern wall. Other examples and related methods are also disclosed herein.

25 Claims, 17 Drawing Sheets

(56) References Cited

U.S. PATENT DOCUMENTS

| | | | |
|---|---|---|---|
| 7,485,951 B2* | 2/2009 | Roper | H01L 23/49816 |
| | | | 257/688 |
| 8,106,495 B2* | 1/2012 | Kajiki | H01L 21/565 |
| | | | 257/E23.18 |
| 8,193,034 B2* | 6/2012 | Pagaila | H01L 24/73 |
| | | | 257/737 |
| 8,501,534 B2* | 8/2013 | Oppermann | H01L 24/81 |
| | | | 438/455 |
| 8,502,370 B2* | 8/2013 | Chan | H01L 21/48 |
| | | | 438/109 |
| 8,941,230 B2* | 1/2015 | Kyozuka | H01L 24/24 |
| | | | 257/E25.018 |
| 9,859,201 B2* | 1/2018 | Shimizu | H01L 21/4857 |
| 10,217,702 B2* | 2/2019 | Lin | H01L 24/19 |
| 11,373,954 B2* | 6/2022 | Kim | H01L 23/13 |
| 11,387,177 B2* | 7/2022 | Chien | H01L 23/5383 |
| 2008/0182400 A1* | 7/2008 | Machida | H01L 24/12 |
| | | | 257/E21.508 |
| 2011/0186997 A1* | 8/2011 | Hwang | H01L 24/48 |
| | | | 257/738 |

\* cited by examiner

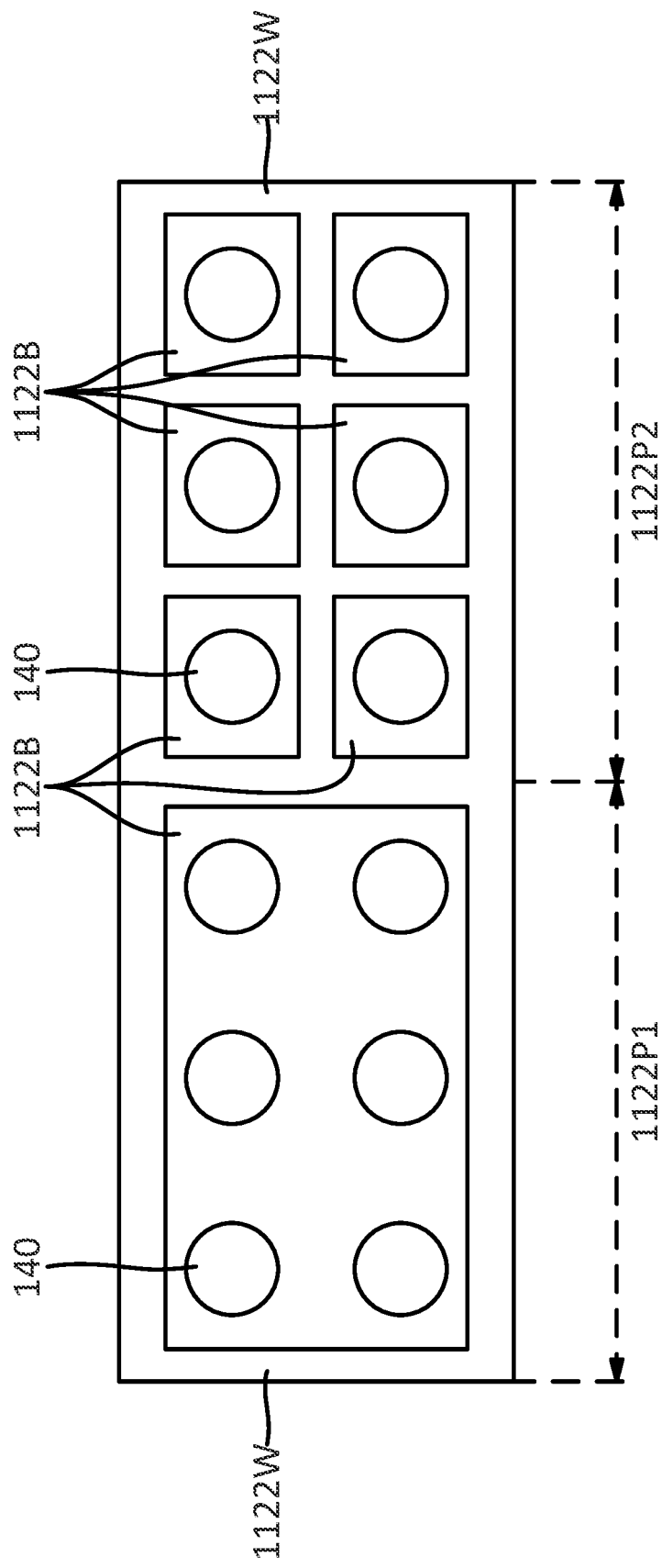

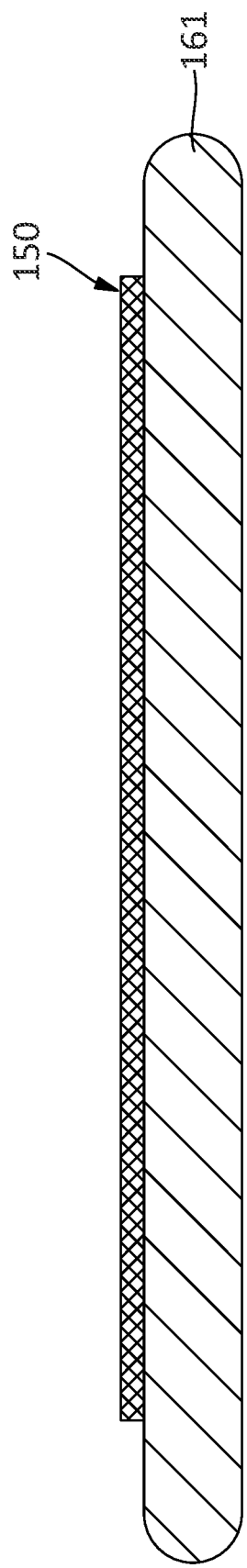
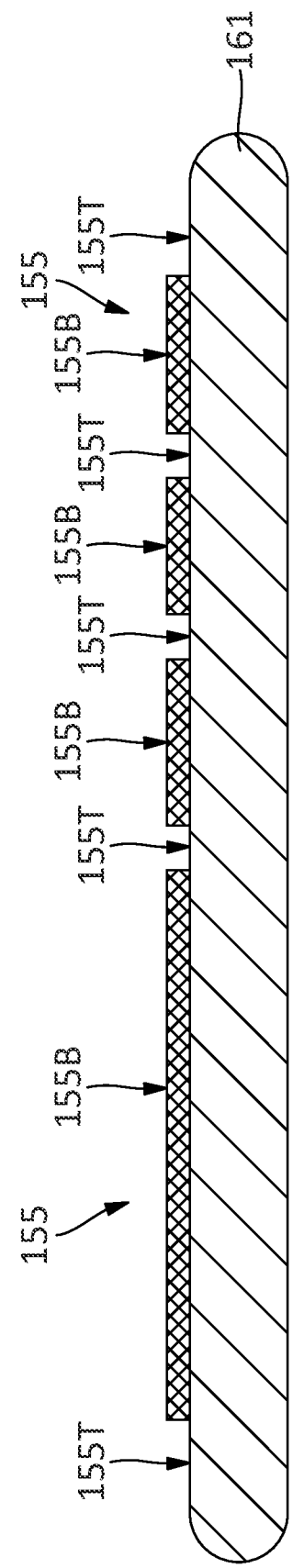

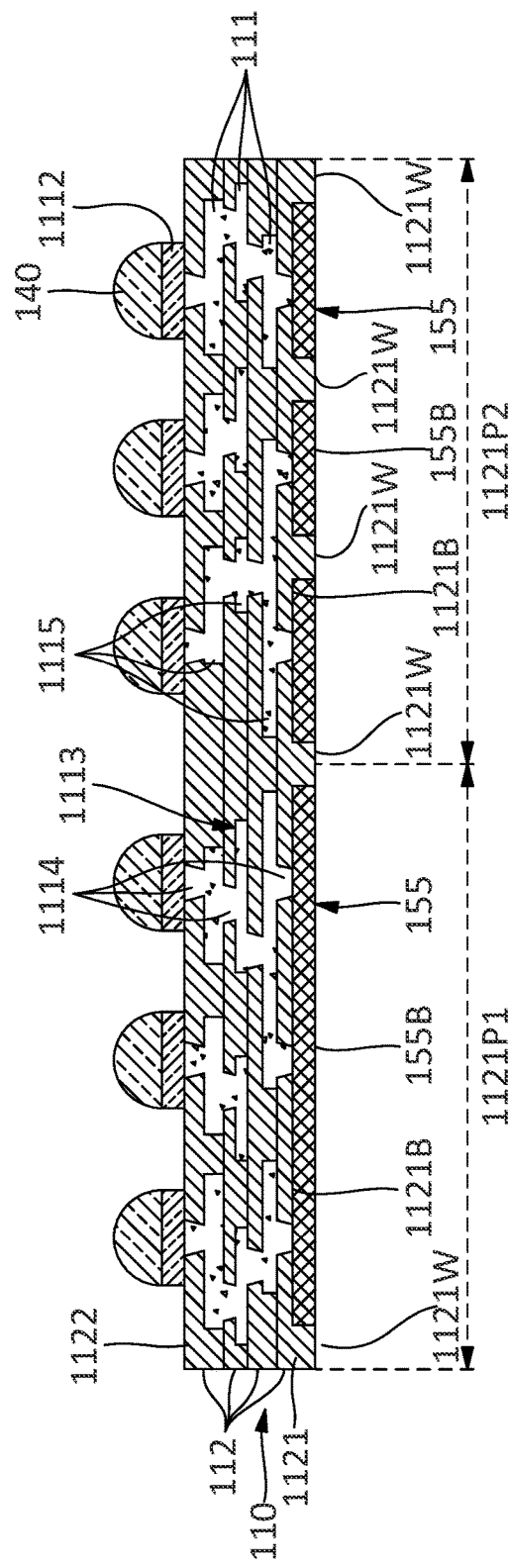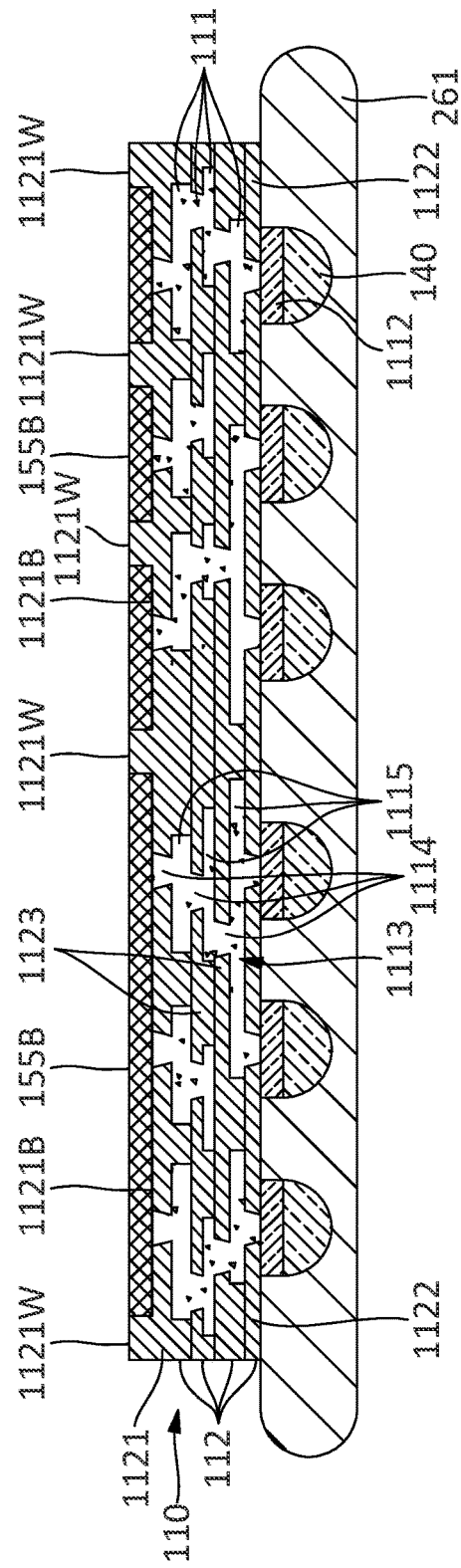
FIG.4B
FIG.4C

SEMICONDUCTOR DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 1A and 1B show a cross-sectional view and a bottom view of an example electronic device.

FIGS. 2A to 2K show cross-sectional views of an example method for manufacturing an example electronic device.

FIGS. 4A to 4G show cross-sectional views of an example method for manufacturing an example electronic device.

Figure 1A:
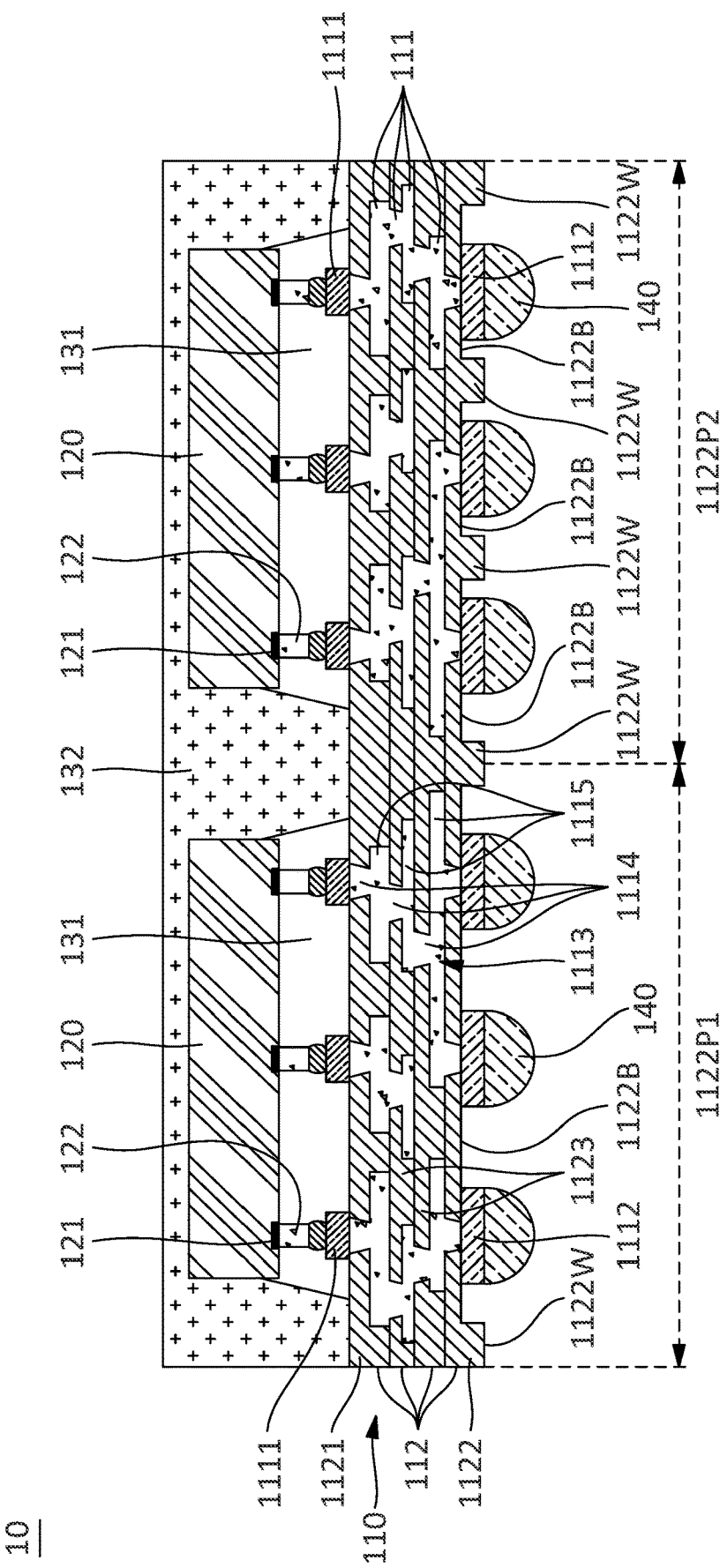

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a substrate comprising a top side and a bottom side, a dielectric structure, and a conductive structure, wherein the conductive structure comprises a first terminal exposed from the dielectric structure, an electronic component over the top side of the substrate, and an encapsulant over the top side of the substrate and covering a lateral side of the electronic component. The dielectric structure comprises a first pattern base and first pattern wall that extends from the first pattern base and is adjacent to the first terminal, and the first terminal is bounded by the first pattern wall.

In another example, a method to manufacture a semiconductor device comprises providing a sacrificial material on a first carrier, the sacrificial material comprising a sacrificial pattern defining a sacrificial base and sacrificial trenches, and forming a substrate over the sacrificial material. The substrate comprises a dielectric structure having first pattern walls and a first pattern base respectively defined by the sacrificial trenches and the sacrificial base of the sacrificial material, and a conductive structure interleaved with the dielectric structure and comprising a first terminal exposed from the dielectric structure. The method further comprises coupling an electronic component to the substrate, wherein a component terminal of the electronic component is coupled with the conductive structure, providing an encapsulant over the substrate and covering lateral sides of the electronic component, and removing the first carrier and the sacrificial material from the substrate to expose the first pattern walls and the first pattern base of the dielectric structure.

In a further example, a method to manufacture a semiconductor device comprises providing a substrate comprising a top side and a bottom side, a dielectric structure, and a conductive structure, providing an electronic component over the top side of the substrate, and providing an encapsulant over the top side of the substrate and covering a lateral side of the electronic component. The dielectric structure comprises a first pattern base and a first pattern wall protruded from the first pattern base, and the conductive structure comprises a first terminal exposed through the first pattern base and bounded by the first pattern wall.

Other examples are included in the present disclosure. Such examples may be found in the figures, in the claims, or in the description of the present disclosure.

FIGS. 1A and 1B show a cross-sectional view and a bottom view of an example electronic device 10. In the example shown in FIG. 1A, electronic device 10 can comprise substrate 110, electronic component 120, component interconnect 122, underfill 131, encapsulant 132, and substrate interconnect 140.

Substrate 110 can comprise a top side and a bottom side, and can comprise conductive structure 111 and dielectric structure 112. Conductive structure 111 can comprise inward terminals 1111, outward terminals 1112, and inner conductors 1113. Inner conductors 1113 can comprise vias 1114 and traces 1115. Inward terminals 1111 or outward terminals 1112 can be exposed from dielectric structure 112. Dielectric structure 112 can comprise inward dielectric 1121, outward dielectric 1122, and inner dielectrics 1123. Outward dielectric 1122 can comprise outward dielectric pattern 1122P1 or outward dielectric pattern 1122P2. Outward dielectric pattern 1122P1 or 1122P2 can comprise pattern wall 1122W and pattern base 1122B, respectively. Pattern wall 1122W can extend from or through pattern base 1122B and can be adjacent to inward terminals 1111 or outward terminals 1112. In some examples, a pattern wall 1122W a pattern base can comprise a single, monolithic dielectric material. Inward terminals 1111 or outward terminals 1112 can be exposed from one or more pattern bases 1122B. Electronic component 120 can comprise component terminals 121 and can be over the top side of substrate 110. Encapsulant 132 also can be over the top side of substrate 110 and can cover a lateral side of electronic component 120. In some examples, encapsulant 132 can contact one or more pattern walls 1122W.

In the example shown in FIG. 1B, outward dielectric pattern 1122P1 can comprise pattern walls 1122W provided as a ring on pattern base 1122B. As also shown in the example of FIG. 1B, outward dielectric pattern 1122P2 can comprise pattern walls 1122W provided as a grid on pattern base 1122B. As seen with respect to outward dielectric pattern 1122P1, multiple substrate interconnects 140 or outward terminals 1112 can be provided bounded in a single common cell defined by pattern walls 1122W. In some examples, bounded can mean completely enclosed, can mean partially enclosed, or can mean adjacent to, and the scope of the disclosed subject matter is not limited in these respects. Substrate interconnects 140 can be coupled with respective outward terminals 1112. As seen with respect to outward dielectric pattern 1122P2, individual substrate interconnects 140 or individual outward terminals 1112 can be provided bounded in respective individual cells of a grid defined by pattern walls 1122W. In some examples, a pattern wall 1122W can comprise a single, continuous wall that bounds one or more inward terminals 111 or one or more outward terminals 1112. In such examples, the pattern wall 1122W can comprise a circular shape, an oval shape, an elliptical shape, an egg shape, a rectangle with rounded corners, and so on. In other examples, two pattern walls 1122W can bound one or more inward terminals 111 or one or more outward terminals 1112, for example where the two pattern walls 1122W form a lemon shape. In yet other examples, the pattern walls 1122W can form any polygon shape, regular or irregular, such as a triangle, rectangle, pentagon, hexagon, and so on, and can bound one or more bound one or more inward terminals 111 or one or more outward terminals 1112. Substrate 110, underfill 131 and encapsulant 132 can be referred to as a semiconductor package and can provide protection for electronic device 10 from external elements or environmental exposure. The semiconductor package can provide electrical coupling between external electrical components and substrate interconnects 140.

Figure 2C:
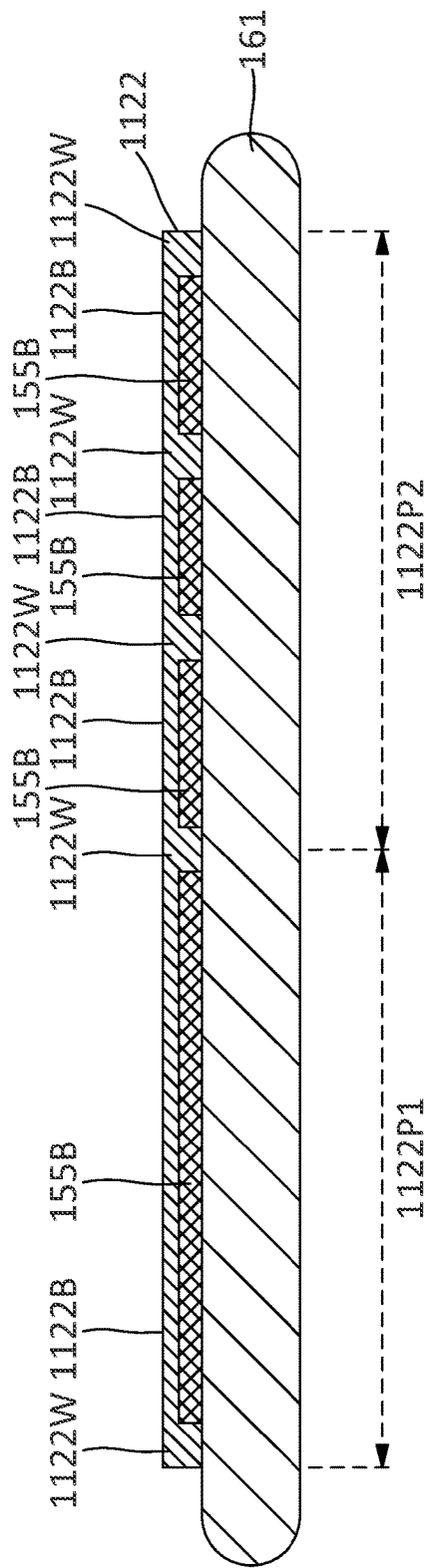

FIGS. 2A to 2K show cross-sectional views of an example method for manufacturing electronic device 10. FIG. 2A shows a cross-sectional view of electronic device 10 at an early stage of manufacture. In the example shown in FIG. 2A, sacrificial layer 150 be provided on support carrier 161. Support carrier 161 can be provided in a substantially flat plate shape. In some examples, support carrier 161 can be provided in the form of a circular wafer or a square panel. In some examples, support carrier 161 can comprise silicon, glass, metal, or ceramic. Sacrificial layer 150 can be provided on the upper side of support carrier 161. In some examples, sacrificial layer 150 can be provided by sputtering, spraying, depositing, or plating on the upper side of support carrier 161. In some examples, sacrificial layer 150 can comprise a sacrificial material that can be provided by chemical vapor deposition (CVD), physical vapor deposition (PVD), atomic layer deposition (ALD), low pressure chemical vapor deposition (LPCVD), or plasma enhanced chemical vapor deposition (PECVD). In some examples, sacrificial layer 150 can be provided on the entire upper side except for the outer perimeter of support carrier 161. In some examples, after providing sacrificial throughout support carrier 161, layer 150, the outer perimeter of support carrier 161 can be exposed. In some examples, sacrificial layer 150 can comprise or be referred to as a seed layer, a metallic layer, or a conductive layer. In some examples, sacrificial layer 150 can comprise or be referred to as tungsten, tungsten-titanium, tungsten-titanium-copper, or copper. In some examples, sacrificial layer 150 can have a thickness of about 1 micrometer ($\mu$m) to about 10 $\mu$m. Sacrificial layer 150 can serve to supply a current to conductive structure 111 during plating of conductive structure 111, or can serve to allow outward dielectric 1122 or outward dielectric patterns 1122P1 and 1122P2 to remain in substrate 110.

FIG. 2B shows a cross-sectional view of electronic device 10 at a later stage of manufacture. In the example shown in FIG. 2B, sacrificial layer 150 can be patterned. In some examples, a photosensitive agent (e.g., photoresist) can first be applied on sacrificial layer 150, and then baking, exposure, and developing processes can be sequentially performed. In the exposure process, the pattern of a mask can be transferred to the photosensitive agent. The pattern can be provided on the photosensitive agent by the developing process, and accordingly, a partial region of sacrificial layer 150 can be exposed through the pattern of the photosensitive agent. A portion of sacrificial layer 150 can be etched using the pattern of the photosensitive agent as a mask. The etching process can comprise dry etching using plasma or wet etching using a solution. In some examples, the dry etching can comprise a reactive ion etching process or a physicochemical etching process. The pattern of the mask can finally be transferred to sacrificial layer 150 by the etching process, and accordingly a partial region of sacrificial layer 150 can be removed. As a portion of sacrificial layer 150 is removed, sacrificial pattern 155 can be provided. In some examples, a partial region of support carrier 161 can be exposed through sacrificial pattern 155.

In some examples, sacrificial pattern 155 can be provided on support carrier 161 by the etching process, and sacrificial pattern 155 can comprise or define sacrificial trench 155T or sacrificial base 155B. In some examples, sacrificial pattern 155 including single wide sacrificial base 155B and sacrificial trench 155T in the form of a ring around sacrificial pattern 155 can be provided (e.g., left side of FIG. 2B). In some examples, sacrificial pattern 155 including a plurality of sacrificial bases 155B spaced apart from each other and grid-shaped sacrificial trenches 155T around sacrificial pattern 155 can be provided (e.g., the right side of FIG. 2B). Some regions of support carrier 161 can be exposed through sacrificial trenches 155T of sacrificial patterns 155. Sacrificial pattern 155 including sacrificial trenches 155T and sacrificial base 155B can be the basis of outward dielectric patterns 1122P1 and 1122P2.

FIG. 2C shows a cross-sectional view of electronic device 10 at a later stage of manufacture. In the example shown in FIG. 2C, outward dielectric 1122 can be provided. In some examples, outward dielectric patterns 1122P1 and 1122P2 can be provided on or defined by sacrificial trenches 155T and sacrificial base 155B. In some examples, pattern walls 1122W can be provided on sacrificial trenches 155T, and pattern base 1122B can be provided on sacrificial base 155B. In some examples, pattern walls 1122W can be attached to support carrier 161 via sacrificial trenches 155T. In some examples, outward dielectric 1122 or outward dielectric patterns 1122P1 and 1122P2 can comprise a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, outward dielectric 1122 or outward dielectric patterns 1122P1 and 1122P2 can be provided by spin coating, spray coating, dip coating, or rod coating and then curing. In some examples, outward dielectric 1122 or outward dielectric patterns 1122P1 and 1122P2 can be provided by CVD, PVD, ALD, LPCVD, or PECVD. In some examples, outward dielectric 1122 or outward dielectric patterns 1122P1 and 1122P2 can have a thickness of about 1 micrometer (μm) to about 10 μm.

Outward dielectric 1122 or outward dielectric patterns 1122P1, 1122P2, including pattern walls 1122W and pattern base 1122B, can be attached to support carrier 161 via, for example, sacrificial trenches 155T, thereby restricting substrate 110 from being delaminated from support carrier 161 during the manufacture of substrate 110, which will later be described. In some examples, since pattern walls 1122W are attached to support carrier 161, deformation of substrate 110 due to thermal expansion and thermal contraction process during the manufacture of substrate 110 can be restricted and the stress applied to substrate 110 can be absorbed, to ultimately restrict substrate 110 from being separated from support carrier 161.

In some examples, outward dielectric pattern 1122P1 including ring-shaped pattern walls 1122W and pattern base 1122B can be provided on one side of support carrier 161 (e.g., the left side of FIG. 2B), and outward dielectric pattern 1122P2 including grid-shaped pattern walls 1122W and a plurality of pattern bases 1122B can be provided on the other side of support carrier 161 (e.g., the right side of FIG. 2B). In some examples, outward dielectric pattern 1122P1 including pattern walls 1122W and pattern base 1122B, all being ring-shaped, can be provided throughout support carrier 161. In some examples, outward dielectric pattern 1122P2 including pattern walls 1122W and a plurality of pattern bases 1122b, all being grid-shaped, can be provided throughout support carrier 161.

Figure 2D:
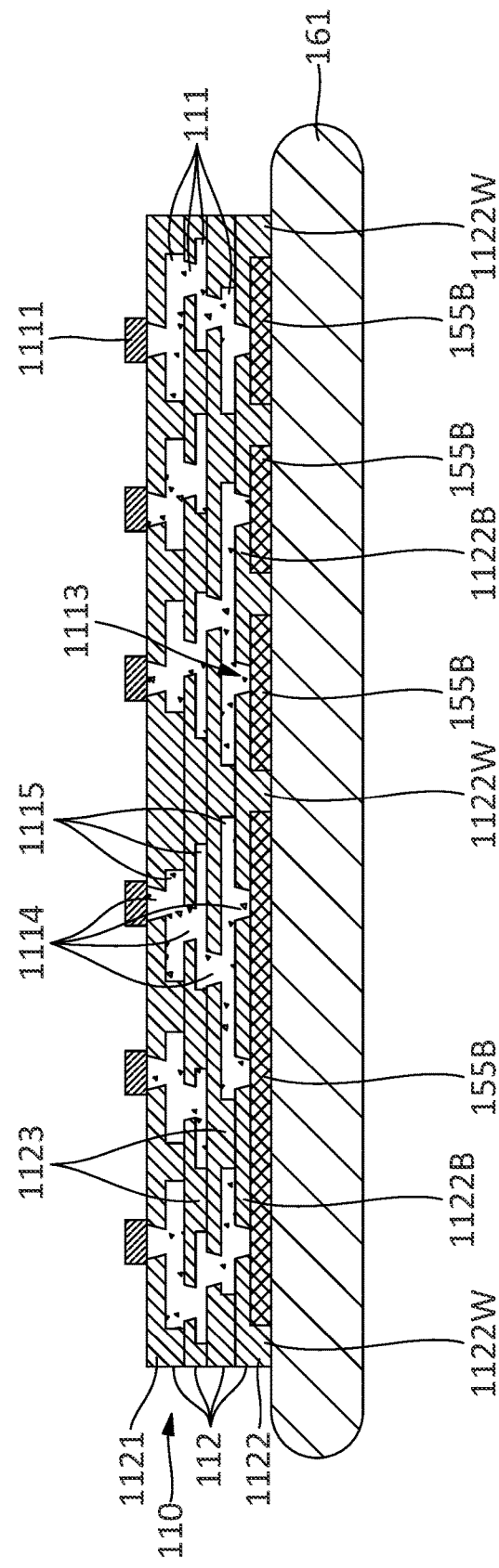

FIG. 2D shows a cross-sectional view of electronic device 10 at a later stage of manufacture. In the example shown in FIG. 2D, further portions of substrate 110 can be provided and formed over sacrificial layer 150. Throughout corresponding alternating stages, one or more layers of conductive structure 111 can be completed, and one or more layers of dielectric structure 112 can be completed. In some examples, conductive structure 111 can be interleaved with dielectric structure 112. In some examples, conductive structure 111 can comprise or be referred to as one or more conductive layers, traces, pads, or vias. In some examples, dielectric structure 112 can comprise or be referred to as one or more dielectric layers or polyimides. In some examples, conductive structure 111 can be provided by plating or depositing copper, a copper alloy, aluminum, an aluminum alloy, gold, a gold alloy, silver, a silver alloy, nickel, or a nickel alloy. In some examples, conductive structure 111 can comprise inner conductors 1113, and dielectric structure 112 can comprise inner dielectrics 1123. In some examples, inner conductors 1113 can be provided coupled to sacrificial layer 150. In some examples, inner conductors 1113 can comprise one or more vias 1114 and one or more traces 1115. In some examples, via 1114 can pass through outward dielectric 1122 to be coupled to sacrificial layer 150, and trace 1115 can be provided on outward dielectric 1122 can be coupled to via 1114. Inner dielectric 1123 can be provided on inner conductor 1113. In some examples, inner conductor 1113 and inner dielectric 1123 can be repeatedly built up multiple times. Inward dielectric 1121 can be provided on inner conductor 1113 or inner dielectric 1123. In some examples, inward dielectric 1121 can have an outward-facing side that is substantially flat. Inward terminal 1111 coupled to via 1114 or trace 1115 on inward dielectric 1121 can be provided through deposition or plating. Inward terminal 1111 can comprise or be referred to as a pad or under bump metallization (UBM). In some examples, multiple inward terminals 1111 protruding on substantially flat inward dielectric 1121 can be arranged. Conductive structure 111 or dielectric structure 112 can be completed by repeating multiple times a deposition or plating process, a photo process, and an etching process. In some examples, individual layers of conductive structure 111 or of dielectric structure 112 can have a thickness of about 1 μm to about 10 μm. In some examples, the overall thickness of substrate 110 can be about 10 μm to about 1000 μm. As described above, substrate 110 including conductive structure 111 and dielectric structure 112 can serve to support electronic component 120 and can couple electronic component 120 and an external device to each other.

In some examples, substrate 110 can be a redistribution layer ("RDL") substrate. RDL substrates can comprise one or more conductive redistribution layers and one or more dielectric layers that (a) can be formed layer by layer over a support carrier that can be entirely removed or at least partially removed after the electronic device and the RDL substrate are coupled together, or (b) can be formed layer by layer over an electronic device to which the RDL substrate is to be electrically coupled. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can comprise one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can comprise a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bis-maleimide triazine (BT) or FR4 and these types of RDL substrates can be referred to as a coreless substrate.

Figure 2E:
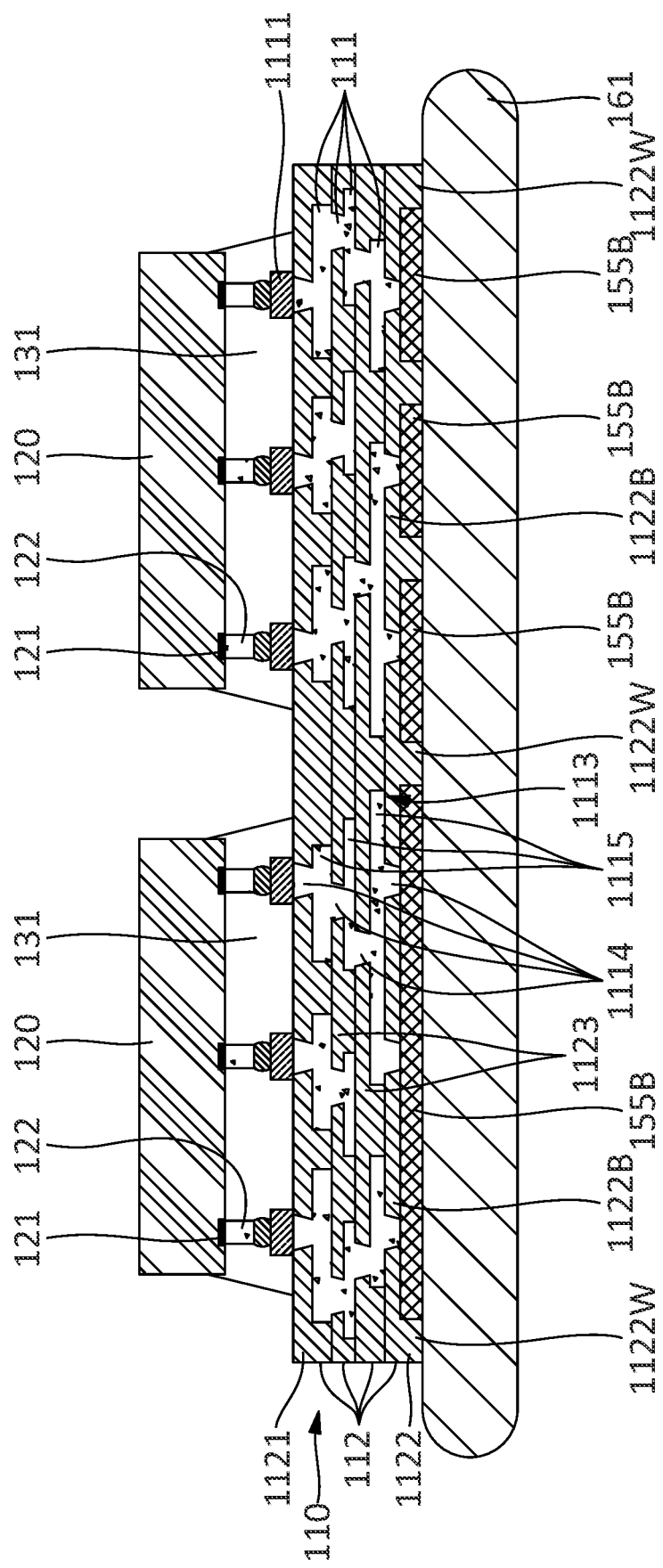

FIG. 2E shows a cross-sectional view of electronic device 10 at a later stage of manufacture. In the example shown in FIG. 2E, one or more electronic component 120 can be provided on substrate 110. In some examples, electronic component 120 can be coupled to inward terminal 1111 of substrate 110. In some examples, electronic component 120 can comprise or be referred to as a semiconductor die, a semiconductor chip, or a semiconductor package. A die or chip can comprise an integrated circuit die separated from a semiconductor wafer. In some examples, electronic component 120 can comprise digital signal processors (DSPs), network processors, power management units, audio processors, radio frequency (RF) circuits, wireless baseband system on chip (SoC) processors, sensors, and application specific integrated circuits. In some examples, electronic component 120 can have a thickness of about 20 μm to about 250 μm. In some examples, electronic component 120 can perform calculation and control processing, data storage, or noise removal from an electrical signal.

In some examples, electronic component 120 can comprise component terminal 121, and component terminal 121 can be electrically coupled to inward terminal 1111 of substrate 110, such as through component interconnect 122. Component interconnect 122 can comprise or be referred to as pads, pillars, posts, or bumps. In some examples, component interconnect 122 can be coupled directly to inward terminal 1111, or component interconnect 122 can be coupled to inward terminal 1111 via a bonding material. In some examples, electronic component 120 can be coupled to inward terminal 1111 by a mass reflow process, a thermal compression process, or a laser assisted bonding process. In some examples component interconnect 122 can have a thickness or width of about 1 μm to about 20 μm. Component interconnect 122 can couple electronic component 120 to substrate 110.

In some examples, underfill 131 can be provided between substrate 110 and electronic component 120. In some examples, underfill 131 can contact or cover flat inward dielectric 1121, inward terminal 1111, electronic component 120 and component interconnect 122. In some examples, underfill 131 can be inserted into a gap between electronic component 120 and substrate 110 after electronic component 120 is coupled to substrate 110. In some examples, underfill 131 can be applied to substrate 110 in advance before electronic component 120 is coupled to substrate 110. Accordingly, electronic component 120 can press underfill 131 and component interconnect 122 can pass through underfill 131 to be coupled to substrate 110. In some examples, a curing process of underfill 131 can be performed.

Figure 2F:
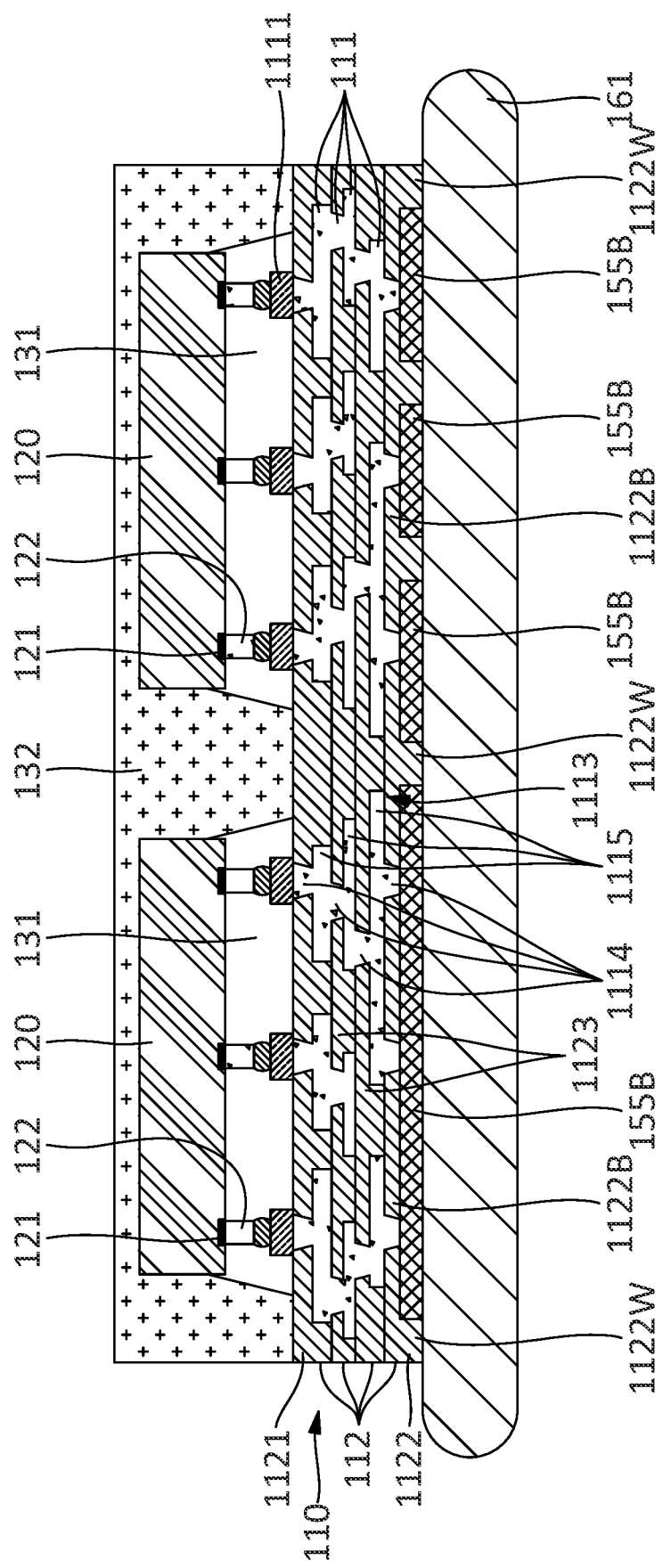

FIG. 2F shows a cross-sectional view of electronic device 10 at a later stage of manufacture. In the example shown in FIG. 2F, encapsulant 132 can be provided. In some examples, encapsulant 132 can cover substrate 110, electronic component 120, and underfill 131. In some examples, encapsulant 132 can be in contact with inward dielectric 1121, underfill 131 and electronic component 120. Encapsulant 132 can cover lateral sides of electronic component 120. In some examples, encapsulant 132 can comprise an epoxy resin or a phenol resin, carbon black, and a silica filler. In some examples, encapsulant 132 can comprise or be referred to as a mold compound, an organic resin with inorganic filler, a sealant, a filler-reinforced polymer, or an organic body. In some examples, encapsulant 132 can be present on the lateral sides and top sides of electronic component 120. In some examples, the upper side of electronic component 120 and the upper side of encapsulant 132 can be coplanar. In some examples, the upper side of electronic component 120 can be exposed through the upper side of encapsulant 132. In some examples, encapsulant 132 can be provided by compression molding, transfer molding, liquid encapsulant molding, vacuum lamination, paste printing, or film assist molding. Compression molding can be a method in which a fluid resin is supplied into a mold in advance, and electronic component 120 can then be put into the mold to harden the fluid resin, and transfer molding can be a method in which a fluid resin is cured by supplying the fluid resin from a gate or supply port of a mold to the periphery of electronic component 120. In some examples, encapsulant 132 can have a thickness of about 100 μm to about 1000 μm. Encapsulant 132 can protect electronic component 120 from exposure to external elements or environments, and can provide structural integrity to substrate 111 and electronic device 10. In some examples, encapsulant 132 can fill between electronic component 120 and substrate 110, such that underfill 131 can be omitted or can be considered part of the same material as encapsulant 132. In some examples where encapsulant 132 comprises a filler, if such filler is smaller than the gap between electronic component 120 and substrate 110, or smaller than the gap between adjacent component interconnects 122, encapsulant 132 can fill between electronic component 120 and substrate 110.

Figure 2G:
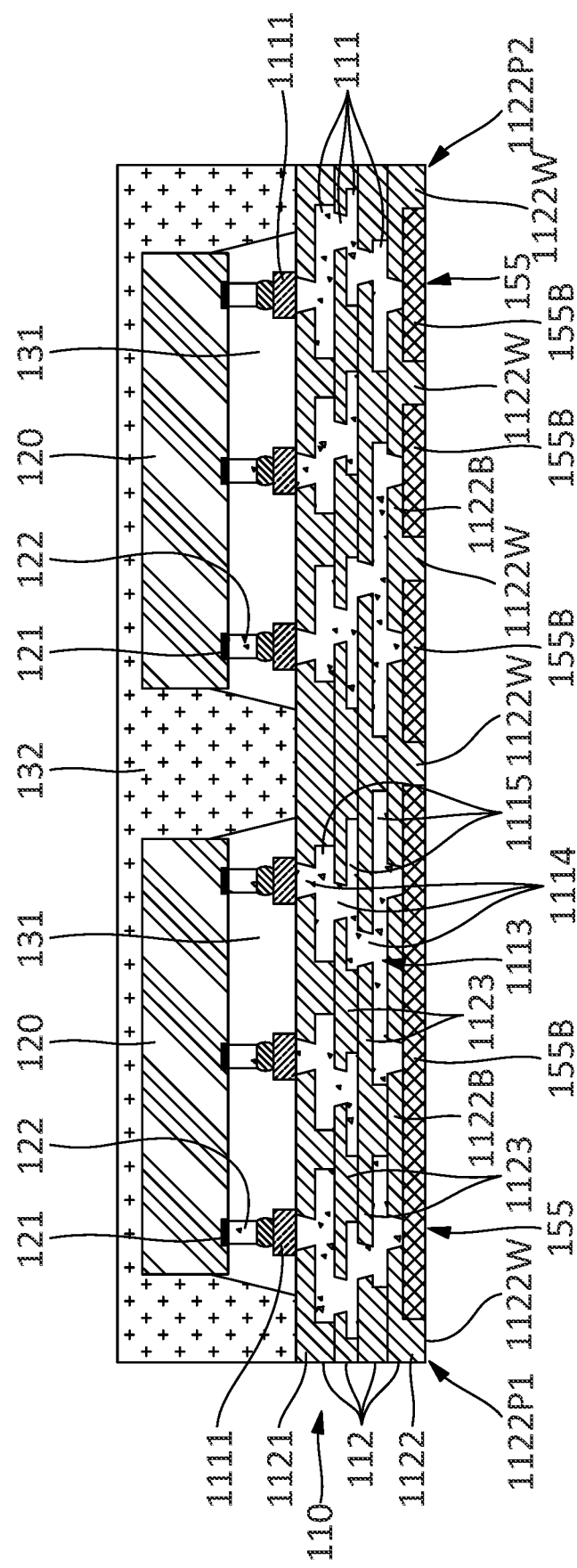

FIG. 2G shows a cross-sectional view of electronic device 10 at a later stage of manufacture. In the example shown in FIG. 2G, support carrier 161 can be removed or separated from substrate 110. In some examples, a wafer support system can be first attached onto encapsulant 132 or electronic component 120, and then support carrier 161 can be removed from substrate 110. In some examples, when a temporary adhesive film is interposed between substrate 110 and support carrier 161, heat or light such as a laser beam can be provided to the temporary adhesive film to thereby reduce the adhesive force of the temporary adhesive film. Thus, support carrier 161 can be easily removed from substrate 110. In some examples, support carrier 161 can be forcibly peeled or twisted off substrate 110 by using a mechanical force. In some examples, support carrier 161 can be removed by mechanical grinding or chemical etching.

By the removal of support carrier 161, a lower side of substrate 110 can be exposed. In some examples, outward dielectric 1122 or outward dielectric patterns 1122P1 and 1122P2, and sacrificial pattern 155 can be exposed. In some examples, sacrificial base 155B of sacrificial pattern 155, and outward dielectric patterns 1122P1 and 1122P2 provided around sacrificial base 155B can be exposed. In some examples, one sacrificial base 155B and ring-shaped pattern walls 1122W provided around the same can be exposed. In some examples, the plurality of sacrificial bases 155B spaced apart from each other and grid-shaped pattern walls 1122W provided around the same can be exposed. In some examples, the lower side of sacrificial base 155B, the lower side of ring-shaped pattern walls 1122W, and the lower side of grid-shaped pattern walls 1122W can be coplanar.

Figure 2H:
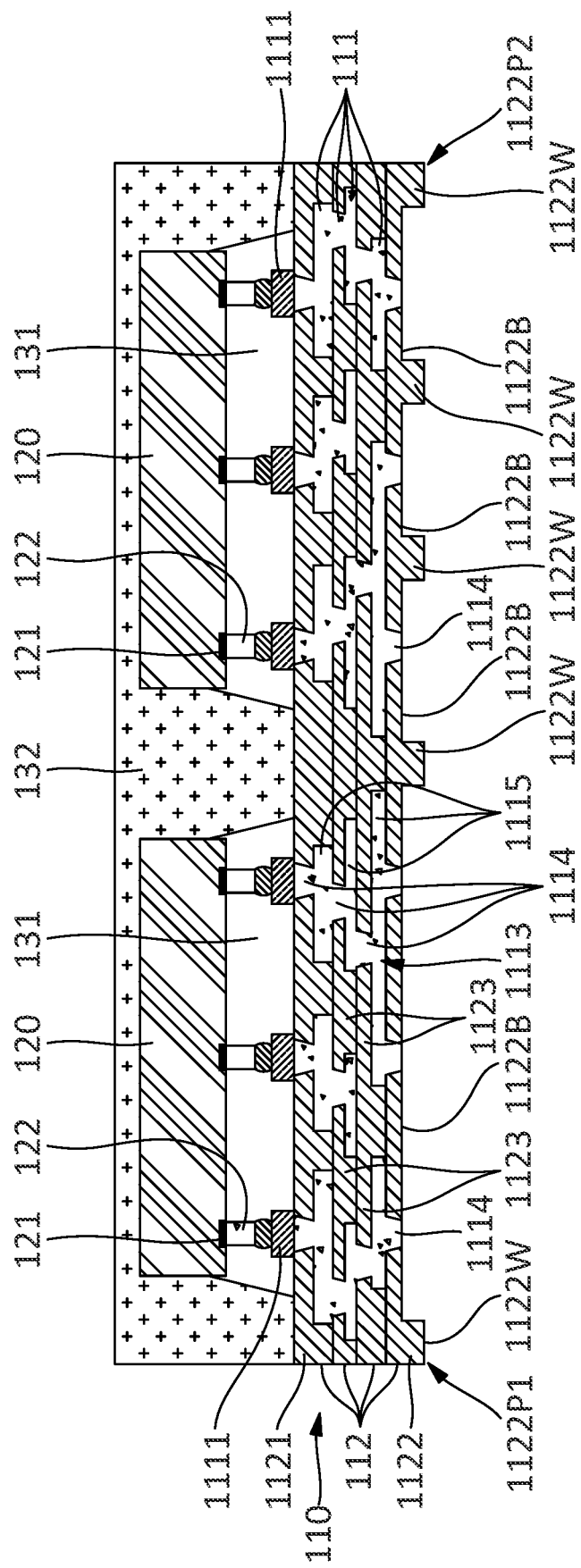

FIG. 2H shows a cross-sectional view of electronic device 10 at a later stage of manufacture. In the example shown in FIG. 2H, sacrificial pattern 155 can be removed. In some examples, sacrificial base 155B of sacrificial pattern 155 can be removed from substrate 110 by wet etching or dry etching. When the sacrificial material is removed from substrate 110, pattern walls 1122W and pattern base 1122B can be exposed. Accordingly, pattern walls 1122W can protrude from pattern base 1122B of outward dielectric 1122.

In some examples, one or more pattern walls 1122W can define a single common cell or ring bounding multiple conductive vias 1114 exposed through pattern base 1122B of outward dielectric 1122 (e.g., the left side of FIG. 2H). In some examples, pattern walls 1122 can define a grid of individual cells or rings bounding single conductive vias 1114 exposed through pattern base 1122B of outward dielectric 1122 (e.g., the right side of FIG. 2H). In some examples, the bottom side of the plurality of conductive vias 1114 can be coplanar with the bottom side of pattern base 1122B.

Figure 2I:
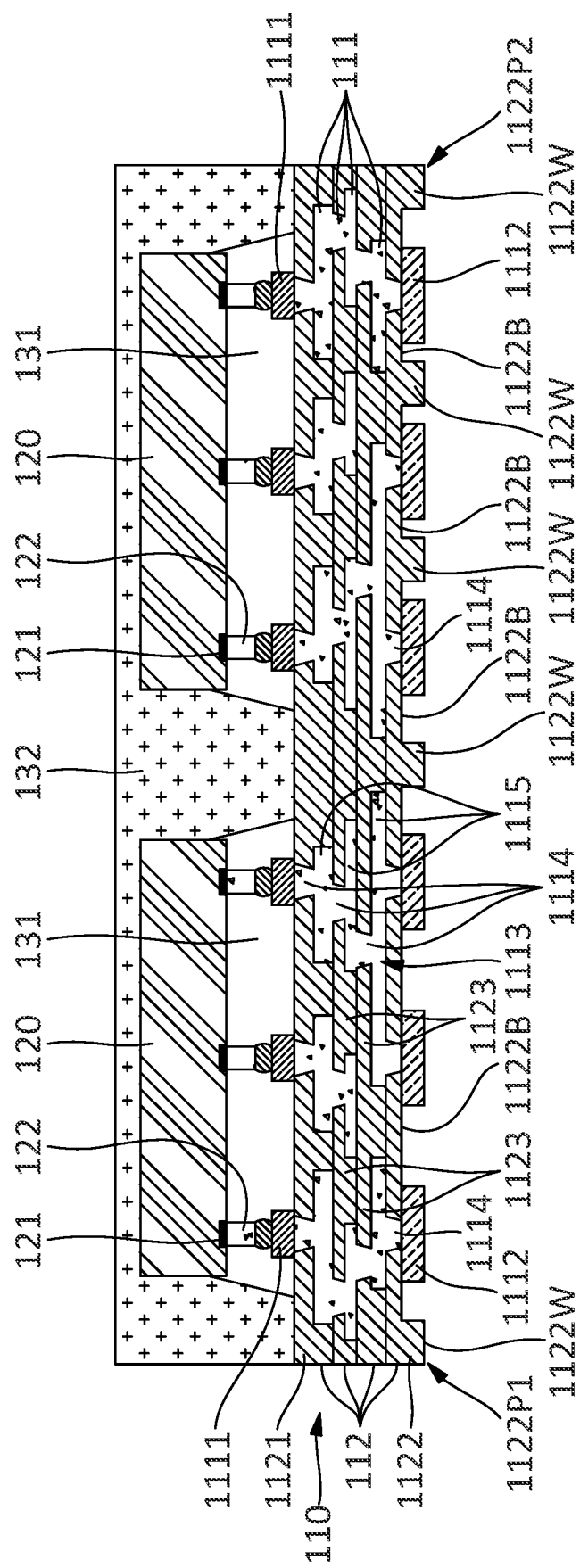

FIG. 2I shows a cross-sectional view of electronic device 10 at a later stage of manufacture. In the example shown in FIG. 2I, outward terminals 1112 can be provided. Outward terminals 1112 can be provided on pattern base 1122B, and can be coupled to conductive via 1114. In some examples, outward terminals 1112 can comprise or be referred to as pads or UBMs. In some examples, outward terminals 1112 can be provided through a plating process or a deposition process. In some examples, outward terminals 1112 can comprise copper, copper alloy, aluminum, aluminum alloy, gold, gold alloy, silver, silver alloy, nickel or nickel alloy. In some examples, the thickness of outward terminals 1112 can be similar or greater than the protrusion thickness of pattern walls 1122W.

Outward terminals 1112 can be laterally spaced apart from pattern walls 1122W. In some examples, pattern walls 1122W need not extend between adjacent outward terminals 1112 (e.g., the left side of FIG. 2I). In some examples, pattern walls 1122W can extend between adjacent outward terminals 1112 (e.g., the right side of FIG. 2I). In some examples, multiple outward terminals 1112 can be provided bounded by a single common cell defined by pattern walls 1122W. In some examples, individual outward terminals 1112 can be provided bounded by respective individual cells of a grid defined by pattern walls 1122W. In some examples, outward terminals 1112 can have a thickness of about 1 μm to about 10 μm. Outward terminals 1112 can serve to couple substrate 110 to an external device. In some examples, substrate 110 can be completed by providing outward terminals 1112.

Figure 2J:
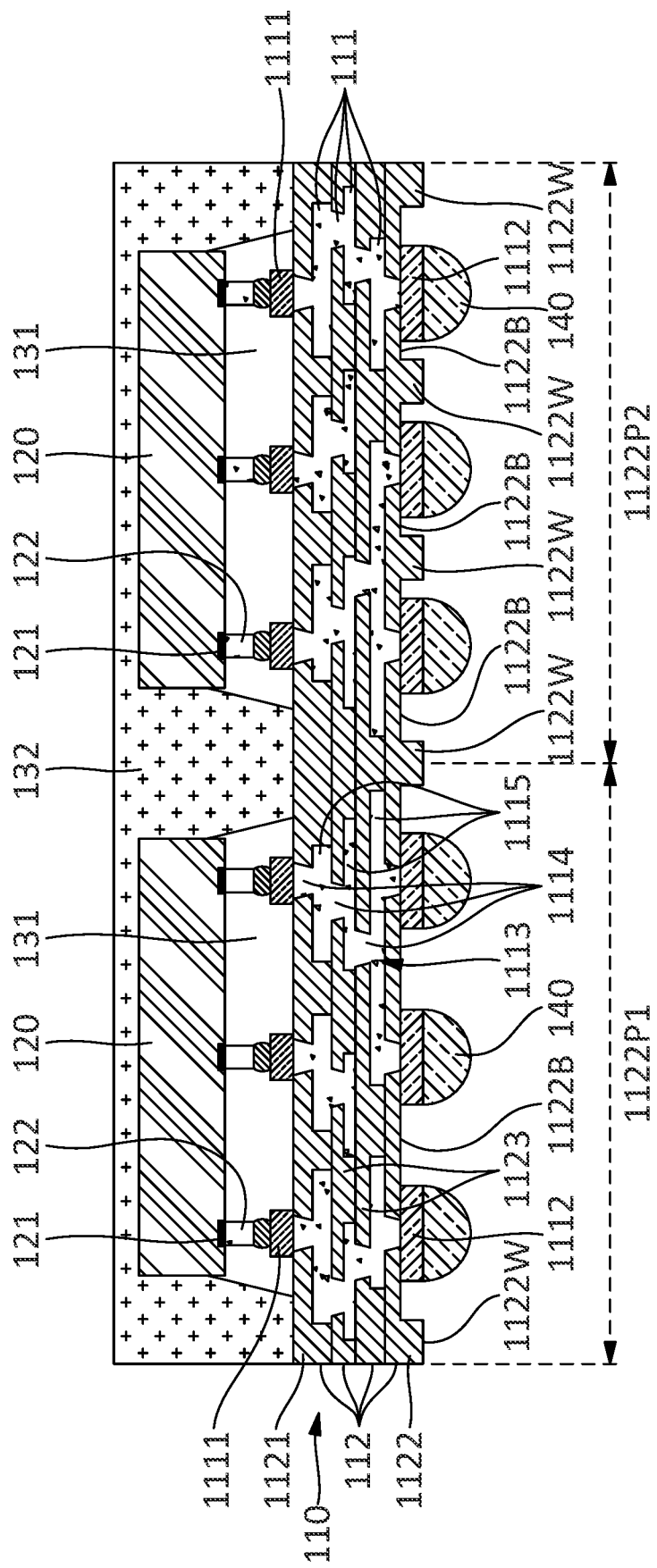

FIG. 2J shows a cross-sectional view of electronic device 10 at a later stage of manufacture. In the example shown in FIG. 2J, substrate interconnect 140 can be provided. Substrate interconnect 140 can be provided by being plated or deposited on outward terminals 1112. Substrate interconnect 140 can comprise or be referred to as conductive balls, conductive bumps, conductive pillars, or solder balls. In some examples, a flux can be provided on outward terminals 1112, and solder balls can be dropped on flux, and then the solder balls can be coupled to outward terminals 1112 through a reflow process or a laser assisted bonding process. In some examples, substrate interconnect 140 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu.

Substrate interconnects 140 can be spaced apart from pattern walls 1122W. In some examples, pattern walls 1122W need not extend between adjacent substrate interconnects 140 (e.g., left side of FIG. 2J). In some examples, pattern walls 1122W can extend between adjacent substrate interconnects 140 (e.g., the right side of FIG. 2J). In some examples, multiple substrate interconnects 140 can be provided bounded by a single common cell defined by pattern walls 1122W. In some examples, individual substrate interconnects 140 can be provided bounded by respective individual cells of a grid defined by pattern walls 1122W. In some examples, substrate interconnects 140 can have a thickness or width of about 0.1 mm to about 10 mm. Substrate interconnects 140 can serve to couple electronic device 10 to an external device. In some examples, substrate interconnects 140 can be considered part of outward terminals 1112. In some examples, electronic component 120 can be at a top side of substrate 110, and pattern wall 1122W and pattern base 11228 can be at a bottom side of substrate 110.

Figure 2K:
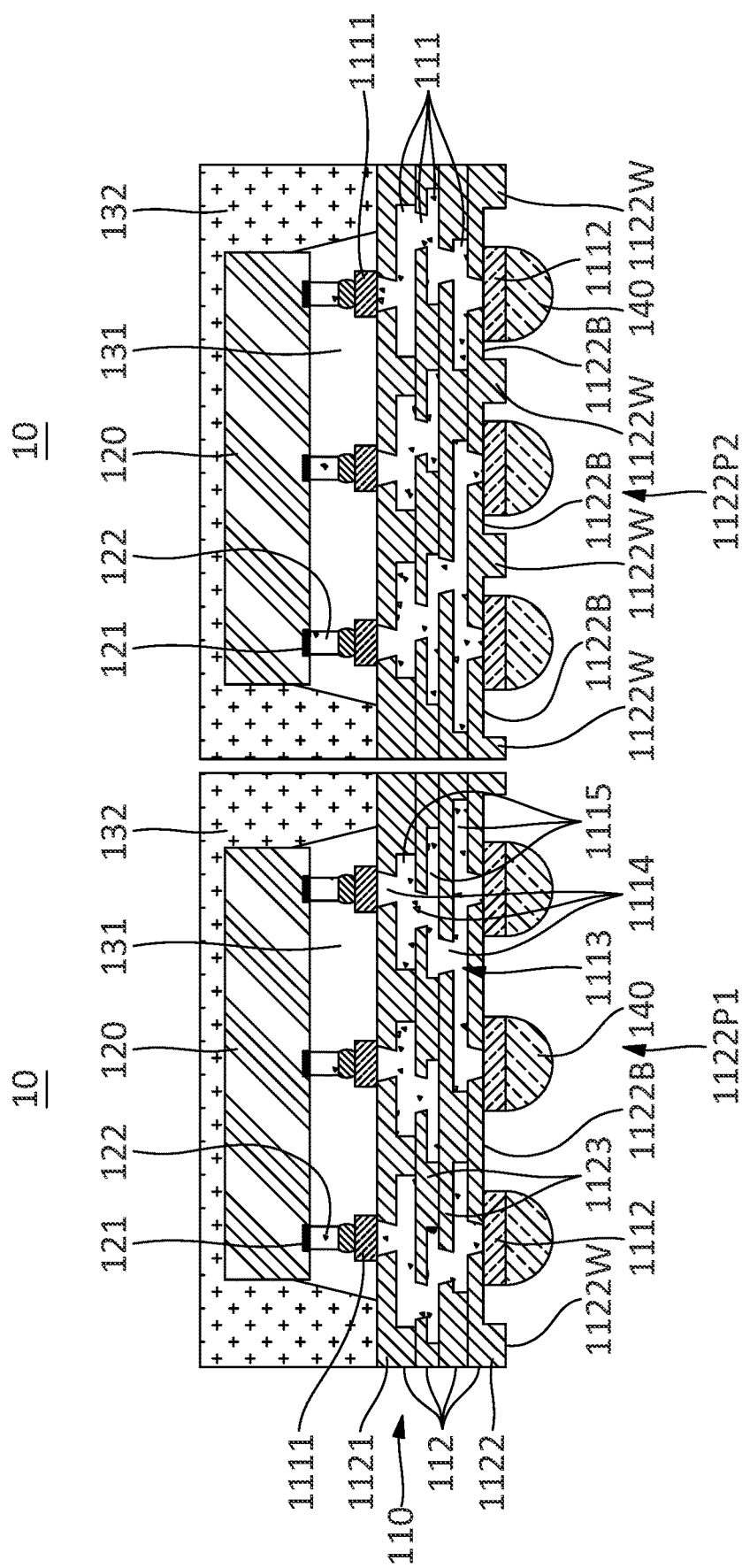

FIG. 2K shows a cross-sectional view of electronic device 10 at a later stage of manufacture. In the example shown in FIG. 2K, a singulation process can be performed. In some examples, the singulation process can be optional, and accordingly, electronic device 10 shown in FIG. 1A can be considered as finalized. In some examples, the singulation process can be performed by a cutting wheel or a laser beam. In some examples, when a plurality of electronic devices 10 are manufactured in an array configuration having rows or columns, the plurality of electronic devices 10 can be separated into individual electronic devices 10 by a singulation or sawing process. In some examples, by sawing encapsulant 132 and substrate 110 through the cut-off wheel, one single electronic device 10 can be provided. The lateral sides of encapsulant 132 and substrate 110 can be coplanar.

In some examples, by the singulation process, electronic device 10 can be provided having ring-shaped pattern wall 1122W of outward dielectric pattern 1122P1 defining a common cell that bounds multiple outward terminals 1112. In some examples, by the singulation process, electronic device 10 can be provided having grid-shaped pattern walls 1122W of outward dielectric pattern 1122P1 defining individual cells that bound respective individual outward terminals 1112.

Figure 3:
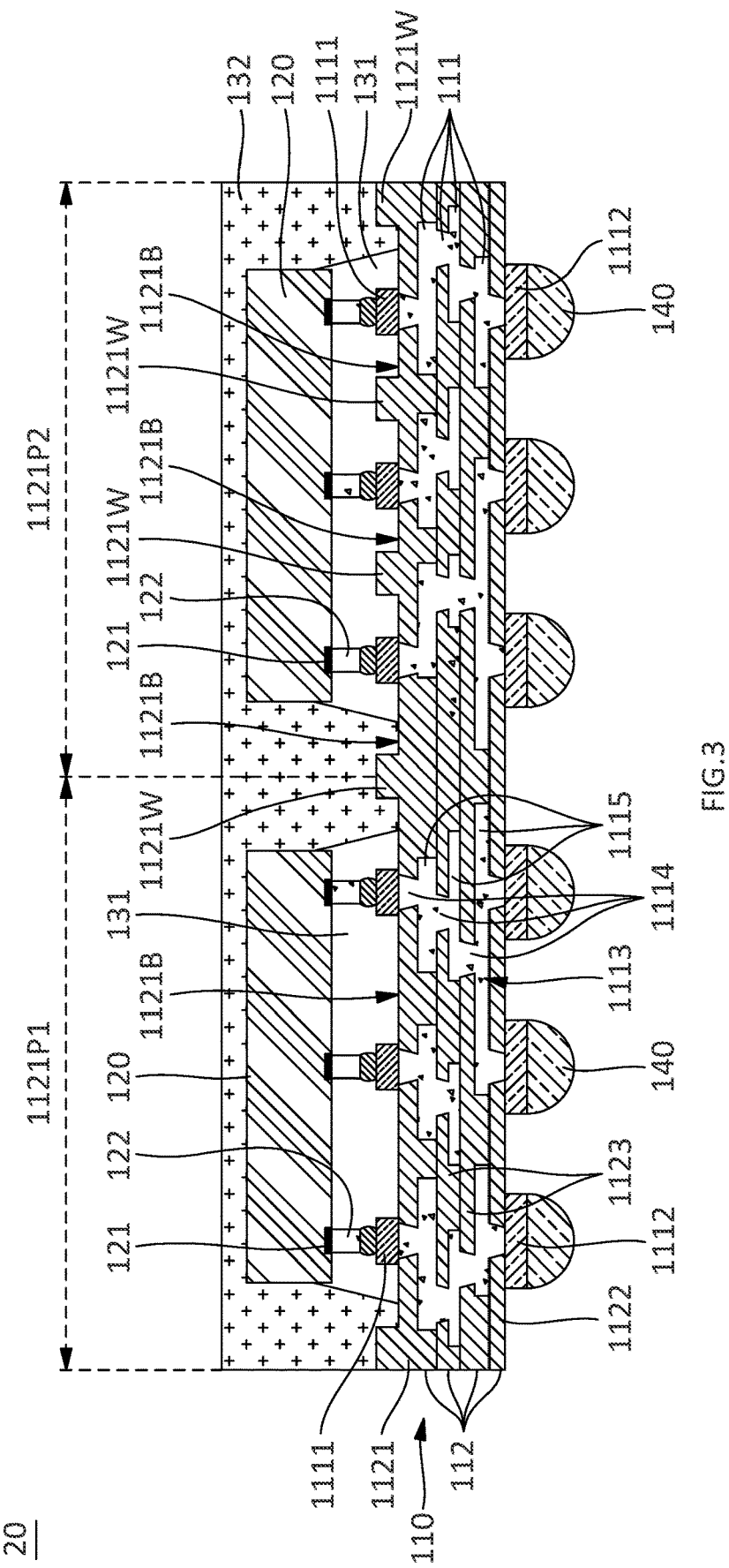
FIG. 3 shows a cross-sectional view of an example electronic device.

FIG. 3 shows a cross-sectional view of an example electronic device 20. Electronic device 20 shown in FIG. 3 can be similar to electronic device 10 shown in FIG. 1A, and comprises inward dielectric patterns 1121P1 and 1121P2 are provided on inward dielectric 1121. Inward dielectric patterns 1121P1 or 1121P2 can be respectively similar to outward dielectric patterns 1122P1 or 1122P2.

In the example shown in FIG. 3, electronic device 20 can comprise substrate 110 provided with inward dielectric patterns 1121P1 and 1121P2 including pattern walls 1121W and pattern bases 1121B of inward dielectric 1121. In inward dielectric pattern 1121P1, pattern walls 1121W can be provided in the form of a ring on pattern base 1121B to define a common cell that bounds multiple inward terminals 1111 (e.g., left side of FIG. 3). In inward dielectric pattern 1121P2, pattern walls 1121W can be provided in the form of a grid on pattern base 1121B to define multiple individual cells that bound respective individual inward terminals 1111 (e.g., the right side of FIG. 3).

In some examples, electronic device 10 can comprise inward dielectric patterns 1121P1 or 1121P2 in addition to outward electronic patterns 1122P1 or 1122P2. In some examples, electronic device 20 can comprise outward electronic patterns 1122P1 or 1122P2 in addition to inward dielectric patterns 1121P1 or 1121P2.

FIGS. 4A to 4G show cross-sectional views of an example method for manufacturing an example electronic device 20. An exemplary method for manufacturing electronic device 20 shown in 4A through 4G can be similar to the exemplary method for manufacturing electronic device 10 shown in FIGS. 2A to 2K, and with inward dielectric patterns 1121P1 or 1121P2 provided at inward dielectric 1121.

In some examples, a process for providing sacrificial layer 150 and a process for patterning sacrificial layer 150 can be similar to the process shown in FIGS. 2A and 2B. In some examples, instead of the process for providing outward dielectric 1122 shown in FIG. 2C, the process for providing inward dielectric 1121 can first be performed. Thereafter, the remaining portions of substrate 110 can be provided.

Figure 4A:
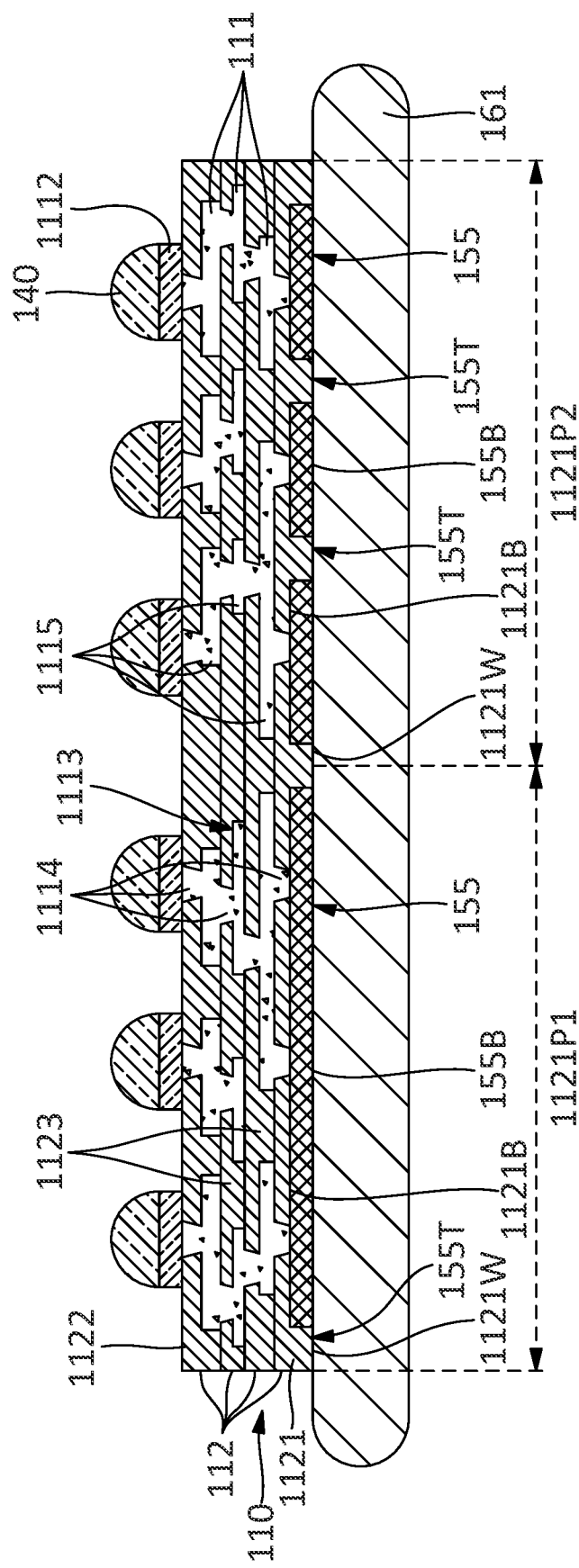

FIG. 4A shows a cross-sectional view of electronic device 20 at an early stage of manufacture. In the example shown in FIG. 4A, substrate 110 can be provided on support carrier 161. In some examples, the process for providing the substrate 110 shown in FIG. 4A can be similar to the process for providing substrate 110 shown in FIGS. 2A-2D. The stacking order, however, of each layer in the process for providing substrate 110 shown in FIG. 4A can be opposite to the stacking order of each layer in the process for providing substrate 110 shown in FIGS. 2A to 2D.

In some examples, after sacrificial layer 150 (i.e., sacrificial pattern 155 including sacrificial bases 155B and sacrificial trenches 155T) is defined on support carrier 161, dielectric structure 112 and conductive structure 111 can be provided. In some examples, inward dielectric 1121 can be provided on support carrier 161 and sacrificial pattern 155. In some examples, inward dielectric pattern 1121P1 can be provided on sacrificial trench 155T and sacrificial base 155B. In some examples, pattern wall 1121W can be provided on sacrificial trenches 155T, and patterned base 1121B can be provided on sacrificial base 155B. In some examples, pattern wall 1121W can be attached to support carrier 161 through sacrificial trench 155T. In some examples inward dielectric 1121, or respective inward dielectric patterns 1121P1 or 1121P2, can be provided by spin-coating, spray-coating, dip-coating, or rod-coating, and then curing. In some examples inward dielectric 1121, or respective inward dielectric patterns 1121P1 or 1121P2, can be provided by a CVD, PVD, ALD, LPCVD, or PECVD process. In some examples inward dielectric 1121, or respective inward dielectric patterns 1121P1 or 1121P2, can have a thickness of about 1 µm (micrometer) to about 10 µm.

Inward dielectric 1121, or respective inward dielectric patterns 1121P1 or 1121P2, including pattern wall 1121W and pattern base 1121B, can be coupled to support carrier 161 through, for example, sacrificial trench 155T. In some examples, because pattern wall 1121W can be attached to support carrier 161, deformation of substrate 110 due to thermal expansion or thermal contraction process during the manufacture of substrate 110 can be restricted, or the stress applied to substrate 110 can be absorbed, to restrict substrate 110 from being separated from support carrier 161.

In some examples, inward dielectric pattern 1121P1 including ring-shaped pattern walls 1121W and pattern base 1121B can be provided on one side of support carrier 161 (e.g., the left side of FIG. 4A), and inward dielectric pattern 1121P2 including grid-shaped pattern walls 1121W and a plurality of pattern bases 1121B can be provided on the other side of support carrier 161 (e.g., the right side of FIG. 4A). In some examples, inward dielectric pattern 1121P1 including pattern walls 1121W and pattern base 1121B, all being ring-shaped, can be provided throughout support carrier 161. In some examples, inward dielectric pattern 1121P2 including pattern walls 1121W and a plurality of pattern bases 1121B, all being grid-shaped, can be provided throughout support carrier 161.

In some examples, conductive structure 111 can be provided coupled to sacrificial base 155B in inward dielectric 1121, and dielectric structure 112 can be provided on inward dielectric 1121. As described above, conductive structure 111 can comprise inner conductors 1113, and dielectric structure 112 can also comprise inner dielectrics 1123. Outward dielectric 1122 can be provided on inner conductors 1113 and inner dielectrics 1123. In some examples, outward terminals 1112 coupled to conductive structure 111 can be provided on outward dielectric 1122. In some examples, substrate interconnect 140 can be provided on outward terminals 1112.

FIG. 4B shows a cross-sectional view of electronic device 20 at a later stage of manufacture. In the example shown in FIG. 4B, support carrier 161 can be removed from substrate 110. The process for removing support carrier 161 shown in FIG. 4B can be similar to the process for removing support carrier 161 shown in FIG. 2G. According to the removal or separation process of support carrier 161, some regions of substrate 110 can be exposed. In some examples, sacrificial pattern 155 including sacrificial base 155B and inward dielectric patterns 1121P1 and 1121P2 can be exposed. In some examples, ring-shaped pattern walls 1121W provided around one sacrificial base 155B or grid-shaped pattern walls 1121W provided around a plurality of sacrificial bases 155B can be exposed. In some examples, lower sides of sacrificial base 155B and of inward dielectric patterns 1121P1 and 1121P2 can be coplanar.

FIG. 4C shows a cross-sectional view of electronic device 20 at a later stage of manufacture. In the example shown in FIG. 4C, substrate 110 can be flipped and attached to support carrier 261. In some examples, substrate interconnect 140 provided in substrate 110 can be fixed to support carrier 261. In some examples, support carrier 261 can comprise a soft adhesive, an adhesive film, or an adhesive tape. In some examples, substantially flat outward dielectric 1122 of substrate 110 can be temporarily bonded to support carrier 261, and substrate interconnect 140 can be temporarily anchored into support carrier 261. Wen support carrier 261 is coupled with substrate 110 as shown in FIG. 4C, the sacrificial material is exposed for removal, and the substrate 110 can be further processed as discussed below.

Figure 4D:
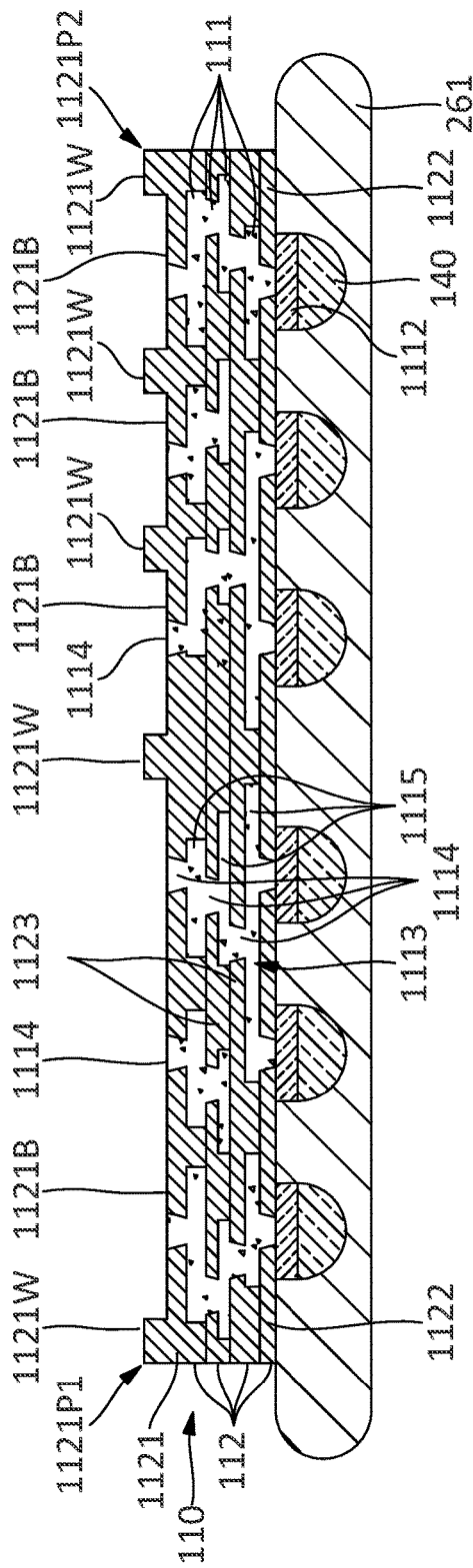

FIG. 4D shows a cross-sectional view of electronic device 20 at a later stage of manufacture. In the example shown in FIG. 4D, sacrificial pattern 155 can be removed. In some examples, sacrificial base 155B of sacrificial pattern 155 can be removed from substrate 110 by wet etching or dry etching. Accordingly, pattern walls 1121W can protrude from pattern base 1121B of inward dielectric 1121.

In some examples, one or more pattern walls 1121W can define a single common cell or ring bounding multiple conductive vias 1114 exposed through pattern base 1121B of inward dielectric 1121 (e.g., the left side of FIG. 4D). In some examples, pattern walls 1121 can define a grid of individual cells or rings bounding respective single conductive vias 1114 exposed through pattern base 1121B of inward dielectric 1121 (e.g., the right side of FIG. 4D). In some examples, the bottom side of the plurality of conductive vias 1114 can be coplanar with the bottom side of pattern base 1121B.

Figure 4E:
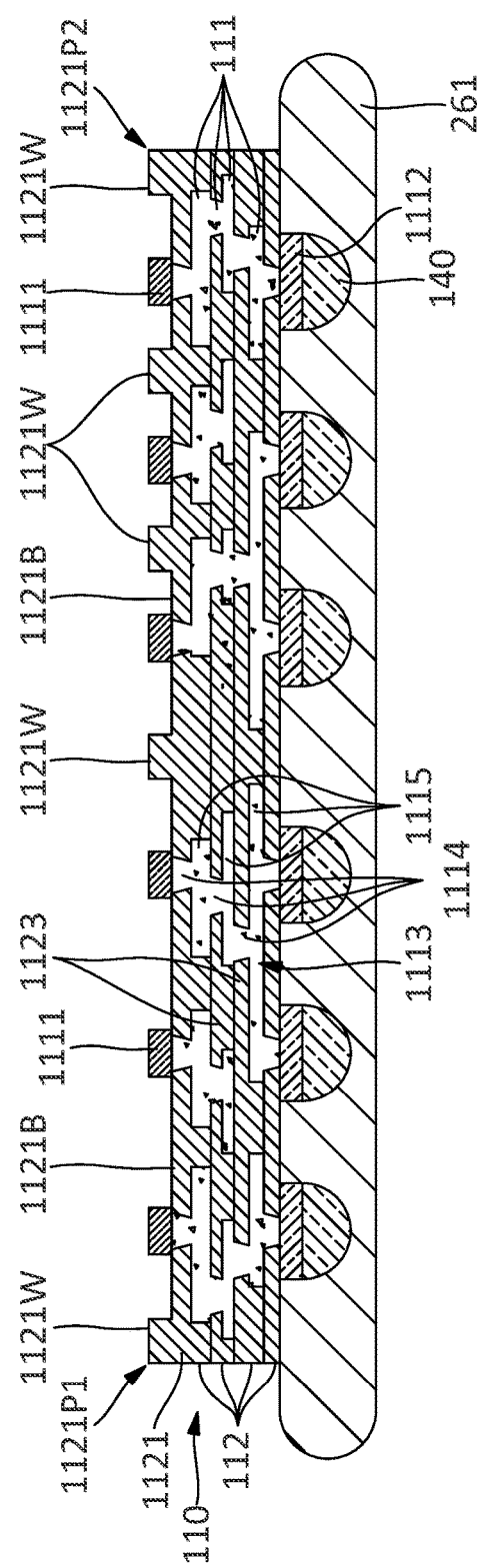

FIG. 4E shows a cross-sectional view of electronic device 20 at a later stage of manufacture. In the example shown in FIG. 4E, inward terminals 1111 can be provided. inward terminals 1111 can be provided on pattern base 1121B and can be coupled to conductive vias 1114. Inward terminals 1111 can comprise or be referred to as pads or UBMs. Inward terminals 1111 can be provided through a plating process or a deposition process. In some examples, inward terminals 1111 can comprise copper, copper alloy, aluminum, aluminum alloy, gold, gold alloy, silver, silver alloy, nickel or nickel alloy. The thickness of inward terminals 1111 can be similar or greater than the protruding thickness of pattern wall 1121W.

In some examples, inward terminals 1111 can be laterally spaced apart from pattern walls 1121W. In some examples, pattern walls 1121W need not extend between adjacent inward terminals 1111 (e.g., the left side of FIG. 4E). In some examples, pattern walls 1121W can extend between adjacent inward terminals 1111 (e.g., the right side of FIG. 4E). In some examples, multiple inward terminals 1111 can be provided bounded by a single common cell defined by pattern walls 1121W. In some examples, individual inward terminals 1111 can be provided bounded by respective individual cells of a grid defined by pattern walls 1121W. In some examples, the thickness of inward terminals 1111 can be about 1 μm to about 10 μm. Inward terminals 1111 can serve to electrically couple electronic component 120 and substrate 110 to each other. In some examples, substrate 110 can be completed by providing inward terminals 1111.

Figure 4F:
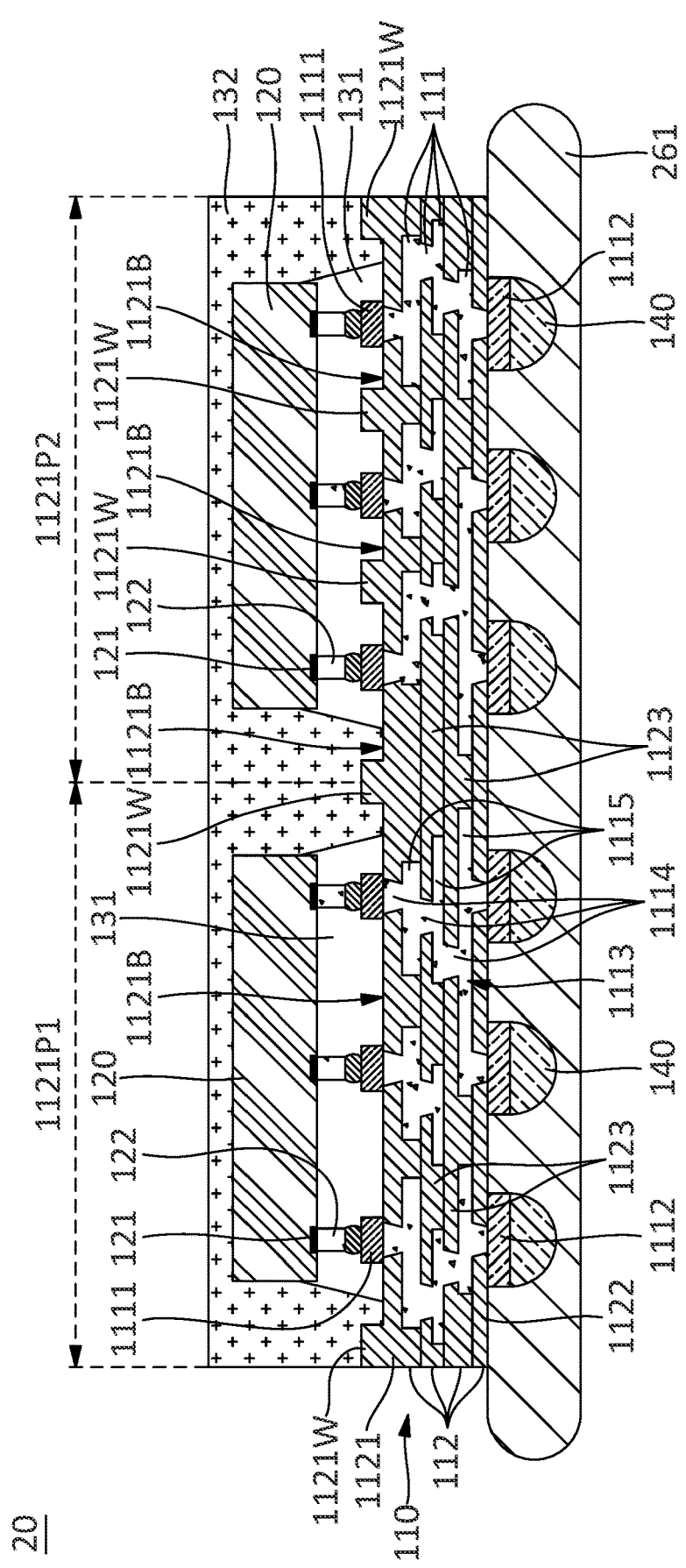

FIG. 4F shows a cross-sectional view of electronic device 20 at a later stage of manufacture. In the example shown in FIG. 4F, electronic component 120 can be provided, and encapsulant 132 or underfill 131 can be provided. The process shown in FIG. 4F can be similar to the process shown in FIGS. 2E and 2F.

In some examples, underfill 131 can cover the common cell defined by ring-shaped pattern wall 1121W of inward dielectric pattern 1121P1 (e.g., the left side of FIG. 4F). Underfill 131 can be spaced apart from or in contact with pattern wall 1121W. In some examples, pattern wall 1121W can serve as a dam to restrict underfill 131 from overflowing. In some examples, the width of ring-shaped pattern wall 1121W can be larger than the width of electronic component 120.

In some examples, underfill 131 can cover the individual cells defined by grid-shaped pattern wall 1121W of inward dielectric pattern 1121P2. In some examples, underfill 131 can contact grid-shaped pattern wall 1121W inside a footprint of electronic component 120. In some examples, grid-shaped pattern wall 1121W outside the footprint of electronic component 120 can be spaced apart from underfill 131. In some examples, underfill 131 can contact grid-shaped pattern wall 1121W outside the footprint of electronic component 120. Grid-shaped pattern wall 1121W outside the footprint of electronic component 120 can serve as a dam to restrict underfill 131 from overflowing. In some examples, encapsulant 132 can fill between electronic component 120 and substrate 110, such that underfill 131 can be omitted or can be considered part of the same material as encapsulant 132. In some examples, electronic component 120 can be at a top side of substrate, and pattern walls 1121W and pattern base 1121B can be at a bottom side of substrate 110. In some examples, inward terminal 1111 on a top side of substrate 110 can be coupled with component terminal 121 of electronic component 120, and outward terminal 1112 on a bottom side of substrate 110 can be coupled with substrate interconnect 140. In some examples, one or more pattern wall 1121W and pattern base 1121B can contact encapsulant 132.

Figure 4G:
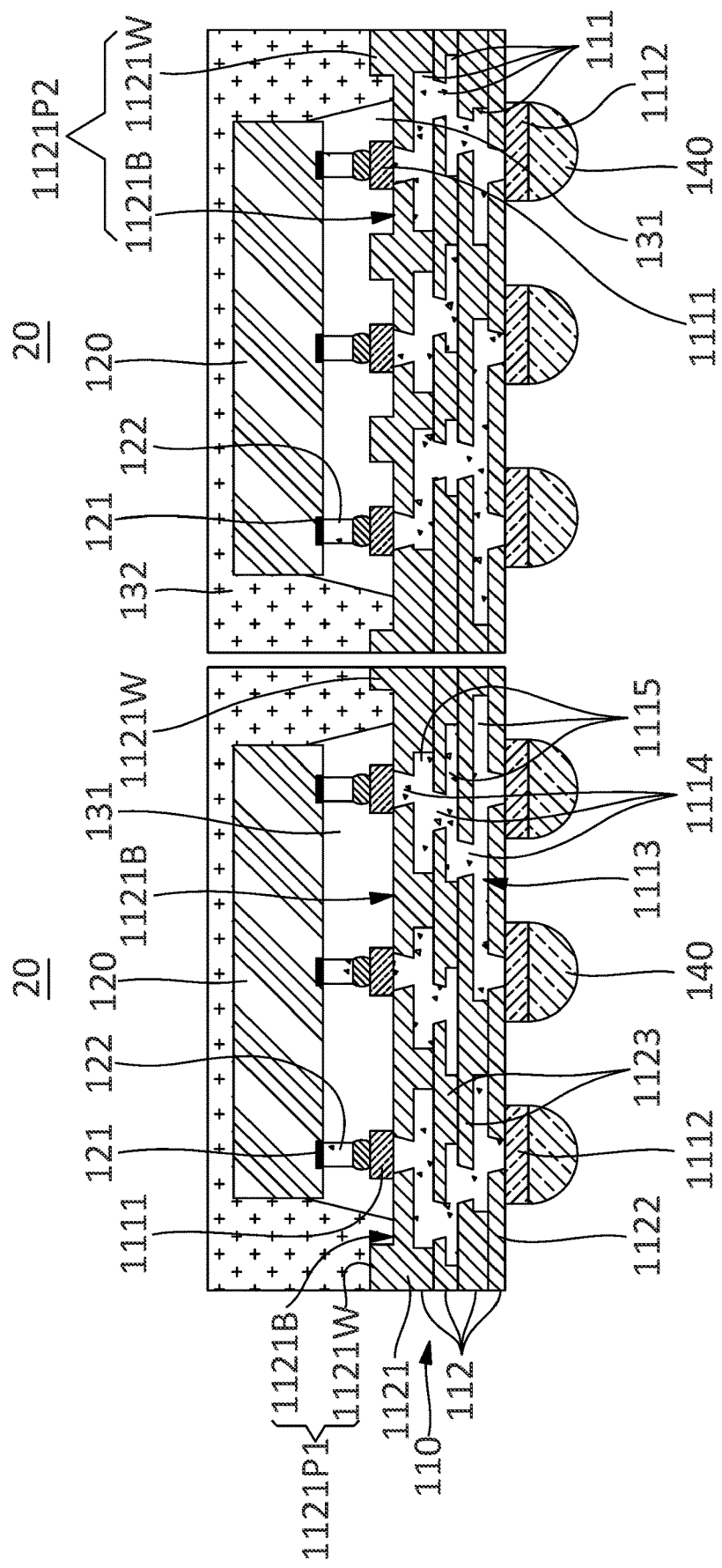

FIG. 4G shows a cross-sectional view of electronic device 20 at a later stage of manufacture. In the example shown in FIG. 4G, support carrier 261 can be removed, and singulation can be carried out. The process for removing support carrier 261 can be similar to the process shown in FIG. 2G or 4B. The singulation process can be similar to the process shown in FIG. 2K. In some examples, the singulation process can be optional, and accordingly, electronic device 20 shown in FIG. 3 can be considered as finalized. In some examples, by sawing encapsulant 132 and substrate 110 through a cut-off wheel, single electronic device 20 can be provided. Accordingly, the lateral sides of encapsulant 132 and substrate 110 can be coplanar.

In some examples, by the singulation process, electronic device 20 can be provided having ring-shaped pattern wall 1121W of inward dielectric pattern 1121P1 defining a common cell that bounds multiple inward terminals 1111. In some examples, by the singulation process, electronic device 20 can be provided having grid-shaped pattern walls 1121W of inward dielectric pattern 1121P1 defining individual cells that bound respective individual inward terminals 1111.

The present disclosure includes reference to certain examples. It will be understood by those skilled in the art, however, that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
   a substrate comprising a top side and a bottom side, a dielectric structure, and a conductive structure, wherein the conductive structure comprises a first terminal exposed from the dielectric structure;
   an electronic component over the top side of the substrate; and
   an encapsulant over the top side of the substrate and covering a lateral side of the electronic component;
   wherein the dielectric structure comprises a first pattern base and first pattern wall that extends from the first pattern base and is adjacent to the first terminal, and the first terminal is bounded by the first pattern wall;
   wherein the first pattern wall is spaced apart from the first terminal; and
   wherein the first pattern base extends laterally from the first pattern wall beyond a footprint of the first pattern wall.

2. The semiconductor device of claim 1, wherein:
   the dielectric structure comprises a second pattern wall that extends from the first pattern base;
   the conductive structure comprises a second terminal adjacent to the first terminal; and
   the first terminal and the second terminal are exposed through the first pattern base and bounded by the first pattern wall and the second pattern wall.

3. The semiconductor device of claim 1, wherein:

the conductive structure comprises a second terminal adjacent to the first terminal;

the dielectric structure comprises a second pattern base and a second pattern wall that extends from the second pattern base;

the first terminal is exposed through the first pattern base; and the second terminal is exposed through the second pattern base and bounded by the second pattern wall.

4. The semiconductor device of claim 1, wherein:
the first terminal comprises an inward terminal coupled with a component terminal of the electronic component.

5. The semiconductor device of claim 1, wherein:
the first terminal comprises an outward terminal coupled with a substrate interconnect.

6. The semiconductor device of claim 1, wherein:
the first pattern wall and the first pattern base are at the top side of the substrate, and the first pattern wall extends upward from the first pattern base.

7. The semiconductor device of claim 1, wherein:
the first pattern wall and the first pattern base are at the bottom side of the substrate, and the first pattern wall extends downward from the first pattern base.

8. The semiconductor device of claim 1, wherein the first pattern wall and the first pattern base comprise a single, monolithic dielectric material.

9. The semiconductor device of claim 1, wherein the encapsulant contacts the first pattern wall.

10. The semiconductor device of claim 1, wherein the first terminal has a thickness that is greater than a protrusion thickness of the first pattern wall.

11. The semiconductor device of claim 1, wherein:
the first pattern base is exposed between the first terminal and the first pattern wall.

12. A method to manufacture a semiconductor device, comprising:
providing a sacrificial material on a first carrier, the sacrificial material comprising a sacrificial pattern defining a sacrificial base and sacrificial trenches;
forming a substrate over the sacrificial material, the substrate comprising:
a dielectric structure having first pattern walls and a first pattern base respectively defined by the sacrificial trenches and the sacrificial base of the sacrificial material; and
a conductive structure interleaved with the dielectric structure and comprising a first terminal exposed from the dielectric structure;
coupling an electronic component to the substrate, wherein a component terminal of the electronic component is coupled with the conductive structure;
providing an encapsulant over the substrate and covering lateral sides of the electronic component;
removing the first carrier and the sacrificial material from the substrate to expose the first pattern walls and the first pattern base of the dielectric structure; and
providing a second carrier coupled to the substrate, wherein the sacrificial material is exposed; and
wherein the conductive structure of the substrate comprises a second terminal that is coupled with a component terminal of the electronic component at one side of the substrate, and the first terminal is coupled with a substrate interconnect at another side of the substrate.

13. The method of claim 12, wherein:
the conductive structure of the substrate comprises a second terminal adjacent to the first terminal; and
the first terminal and the second terminal are exposed through the first pattern base and bounded by the first pattern walls.

14. The method of claim 12, wherein:
the first pattern walls and the first pattern base contact the encapsulant.

15. The method of claim 12, wherein:
the electronic component is at a top side of the substrate; and
the first pattern walls and the first pattern base are at a bottom side of the substrate.

16. A method to manufacture a semiconductor device, comprising:
providing a substrate comprising a top side and a bottom side, a dielectric structure, and a conductive structure;
providing an electronic component over the top side of the substrate; and
providing an encapsulant over the top side of the substrate and covering a lateral side of the electronic component;
wherein:
the dielectric structure comprises a first pattern base and a first pattern wall protruded from the first pattern base;
the conductive structure comprises a first terminal exposed through the first pattern base and bounded by the first pattern wall;
the first pattern wall is spaced apart from the first terminal; and
the first pattern base extends laterally from the first pattern wall beyond a footprint of the first pattern wall.

17. The method of claim 16, wherein:
the first pattern wall is at the top side of the substrate.

18. The method of claim 16, wherein:
the first pattern wall is at the bottom side of the substrate.

19. The method of claim 16, wherein:
the dielectric structure comprises a second pattern wall protruded from the first pattern base;
the conductive structure comprises a second terminal adjacent to the first terminal; and
the first terminal and the second terminal are exposed through the first pattern base and bounded by the first pattern wall and the second pattern wall.

20. The method of claim 16, wherein:
the conductive structure comprises a second terminal adjacent to the first terminal;
the dielectric structure comprises a second pattern base and a second pattern wall extending from the second pattern base;
the first terminal is exposed through the first pattern base; and
the second terminal is exposed through the second pattern base and bounded by the second pattern wall.

21. A semiconductor device, comprising:
a substrate comprising a top side and a bottom side, a dielectric structure, and a conductive structure, wherein the conductive structure comprises a first inward terminal at the top side of the substrate;
an electronic component over the top side of the substrate, wherein the electronic component comprises component terminal coupled with the first inward terminal; and
an encapsulant over the top side of the substrate and covering a lateral side of the electronic component;
wherein the dielectric structure comprises a first pattern base and first pattern wall that extends from the first pattern base and is adjacent to the first inward terminal, and the first inward terminal is bounded by the first pattern wall; and wherein the first pattern base and the first pattern wall are on the top side of the substrate, and the first pattern wall extends in an upward direction from the first pattern base.

22. The semiconductor device of claim 21, wherein the first pattern wall is spaced apart from the first inward terminal.

23. The semiconductor device of claim 21, wherein the first pattern base extends laterally from the first pattern wall beyond a footprint of the first pattern wall.

24. The semiconductor device of claim 21, wherein the encapsulant covers a top side of the first pattern base and a lateral side of the first pattern wall.

25. The semiconductor device of claim 21, wherein:
the dielectric structure comprises a second pattern wall that extends from the first pattern base;
the conductive structure comprises a second inward terminal adjacent to the first inward terminal; and
the second inward terminal is bounded by the second pattern wall.

\* \* \* \* \*